(12) United States Patent
Aoki

(10) Patent No.: US 11,799,053 B2
(45) Date of Patent: Oct. 24, 2023

(54) METHOD OF MANUFACTURING LIGHT-EMITTING DEVICE

(71) Applicant: NICHIA CORPORATION, Anan (JP)

(72) Inventor: Yusuke Aoki, Anan (JP)

(73) Assignee: NICHIA CORPORATION, Anan (JP)

(*) Notice: Subject to any disclaimer, the term of this patent is extended or adjusted under 35 U.S.C. 154(b) by 363 days.

(21) Appl. No.: 17/157,570

(22) Filed: Jan. 25, 2021

(65) Prior Publication Data

US 2021/0234062 A1    Jul. 29, 2021

(30) Foreign Application Priority Data

Jan. 29, 2020 (JP) ................ 2020-012479

(51) Int. Cl.
*H01L 33/00* (2010.01)
*H01L 25/075* (2006.01)

(52) U.S. Cl.
CPC ........ *H01L 33/005* (2013.01); *H01L 25/0753* (2013.01)

(58) Field of Classification Search
CPC combination set(s) only.
See application file for complete search history.

(56) References Cited

U.S. PATENT DOCUMENTS

| 8,426,227 | B1 | 4/2013 | Bibl et al. |
| 2018/0269234 | A1 | 9/2018 | Hughes et al. |
| 2018/0366450 | A1 | 12/2018 | Gardner et al. |
| 2020/0126963 | A1* | 4/2020 | Lee ..................... H01L 33/0093 |
| 2021/0273130 | A1* | 9/2021 | Sang ................... H01L 25/0753 |

FOREIGN PATENT DOCUMENTS

| JP | 2007-329234 A | 12/2007 |
| JP | 2012-094591 A | 5/2012 |
| JP | 2015-500562 A | 1/2015 |
| JP | 2018-508971 A | 3/2018 |
| JP | 2018-142713 A | 9/2018 |
| JP | 2018-531504 A | 10/2018 |
| WO | WO-2017/037475 A1 | 3/2017 |

* cited by examiner

*Primary Examiner* — Ratisha Mehta
(74) *Attorney, Agent, or Firm* — Foley & Lardner LLP

(57) ABSTRACT

A method of manufacturing a light-emitting device includes: providing a structure body including: a first substrate having a first surface and a second surface opposite to the first surface, the first surface including first regions and second regions; first light-emitting element portions respectively located on the first regions; and second light-emitting element portions respectively located on the second regions; fixing the first light-emitting element portions to a second substrate without fixing the second light-emitting element portions to the second substrate; subsequently, transferring the first light-emitting element portions from the first substrate to the second substrate by removing, from the second surface, portions of the first substrate overlapping the first regions when viewed from the second surface; and subsequently, separating the first light-emitting element portions from the second substrate in a state in which the second light-emitting element portions are located on the second regions.

17 Claims, 12 Drawing Sheets

METHOD OF MANUFACTURING LIGHT-EMITTING DEVICE

CROSS-REFERENCE TO RELATED APPLICATION

This application claims priority to Japanese Patent Application No. 2020-012479, filed on Jan. 29, 2020, the disclosure of which is hereby incorporated by reference in its entirety.

BACKGROUND

The present disclosure relates to a method of manufacturing a light-emitting device.

For example, the assembly of semiconductor devices including a plurality of pixels is known (WO 2017/037475). It is desirable to improve the producibility of a method of manufacturing a light-emitting device.

SUMMARY

According to certain embodiment of the present disclosure, a method of manufacturing a light-emitting device may allow for improved producibility.

According to the certain embodiment of the present disclosure, a method of manufacturing a light-emitting device includes: a structure body providing step, a first structure body fixing step, a first transfer step, and a separation step. In the structure body providing step, a structure including a first substrate having a first surface and a second surface opposite to the first surface, the first surface including a plurality of first regions and a plurality of second regions, first light-emitting element portions are respectively located on the first regions of the first surface, and second light-emitting element portions are respectively located on the second regions of the first surface is provided. In the first structure body fixing step, the first light-emitting element portions are fixed to a second substrate without fixing the second light-emitting element portions to the second substrate while the first light-emitting element portions and the second light-emitting element portions face the second substrate. In the first transfer step after the first structure body fixing step, the first light-emitting element portions are transferred from the first substrate to the second substrate by removing, from the second surface, portions of the first substrate overlapping with the first regions when viewed from the second surface. In the separation step after the first transfer step, the first light-emitting element portions are separated from the second substrate in a state in which the second light-emitting element portions are located on the second regions.

According to certain embodiments of the present disclosure, a method of manufacturing a light-emitting device may provide for improved producibility.

DETAILED DESCRIPTION

Figure 1A:
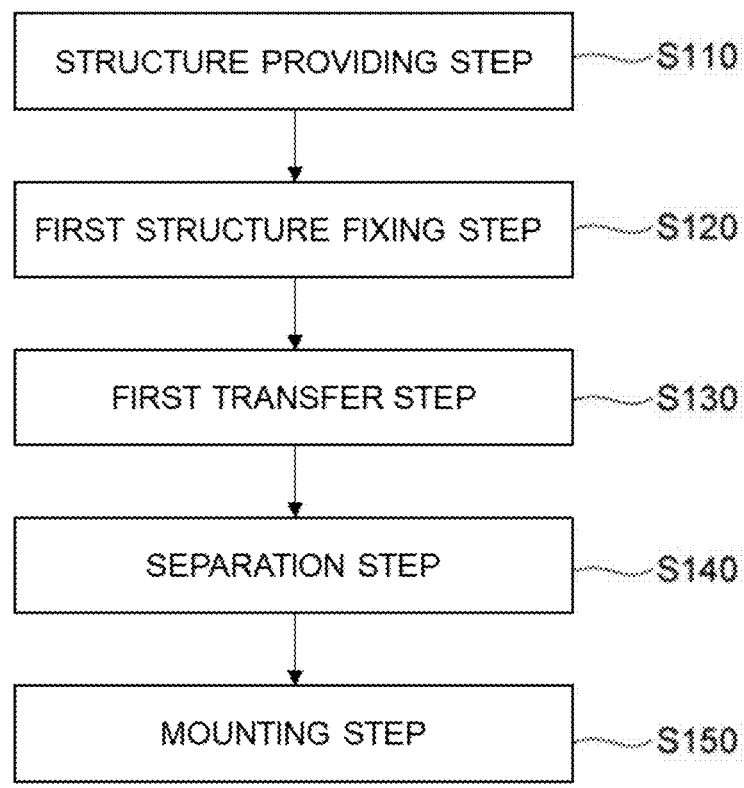
FIG. 1A is a flowchart illustrating a method of manufacturing a light-emitting device according to an embodiment.

Certain embodiments of the present disclosure will be described below with reference to the accompanying drawings.

The drawings are schematic or conceptual, and the relationship between a thickness and a width of each component, the ratio between sizes of components, etc., in the drawings may not be the same as those of an actual product. Also, the dimensions and ratios of the same component in different drawings may be different from each other.

In the specification of the present application, an element that is the same as that in a drawing that has been previously described is indicated with the same reference numeral, and its repeated detailed description is omitted as appropriate.

Figure 1B:
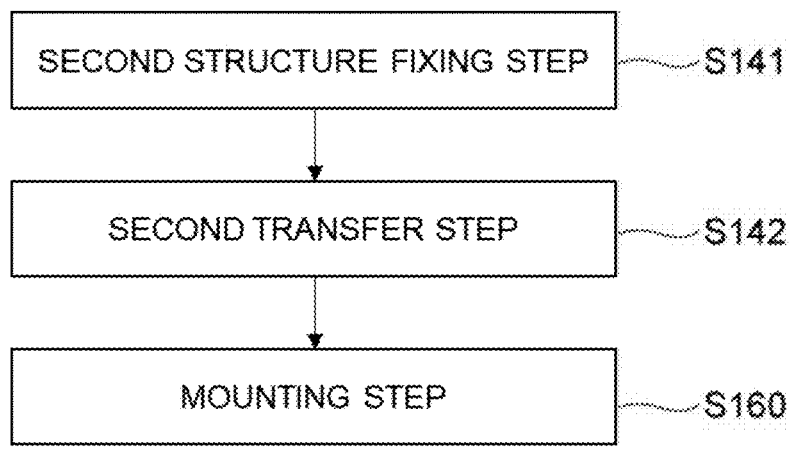
FIG. 1B is a flowchart illustrating the method of manufacturing a light-emitting device according to the embodiment.

FIG. 1A and FIG. 1B are flowcharts illustrating a method of manufacturing a light-emitting device according to the embodiment. FIG. 2A to FIG. 15A are schematic cross-sectional views illustrating the method of manufacturing a light-emitting device according to the embodiment. FIG. 2B to FIG. 15B are schematic plan views illustrating the method of manufacturing a light-emitting device according to the embodiment. The schematic plan views of FIG. 2B to FIG. 15B respectively correspond to the schematic cross-sectional views of FIG. 2A to FIG. 15A.

As shown in FIG. 1A, the method of manufacturing a light-emitting device according to the present embodiment includes Structure Body Providing Step S110, First Structure Body Fixing Step S120, First Transfer Step S130, and Separation Step S140. The method of manufacturing a light-emitting device according to the present embodiment may also include Second Structure Body Fixing Step S141 and Second Transfer Step S142 illustrated in FIG. 1B.

Figure 2A:
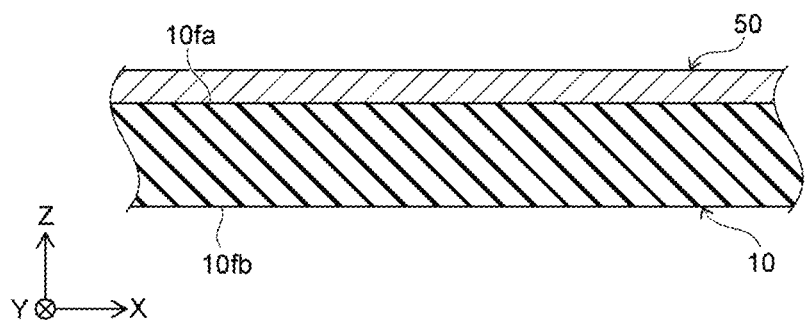
FIG. 2A is a schematic cross-sectional view illustrating the method of manufacturing a light-emitting device according to the embodiment.
Figure 2B:
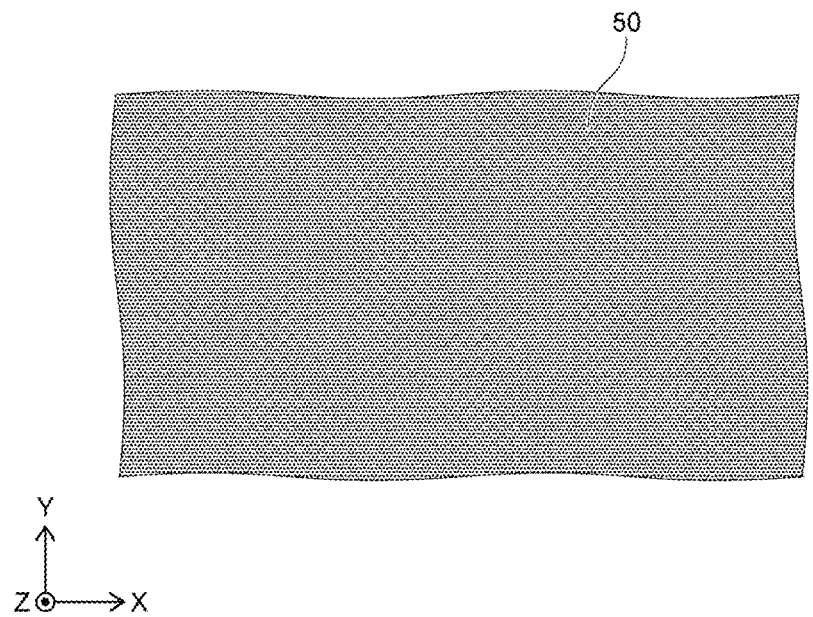
FIG. 2B is a schematic plan view illustrating the method of manufacturing a light-emitting device according to the embodiment.
Figure 3A:
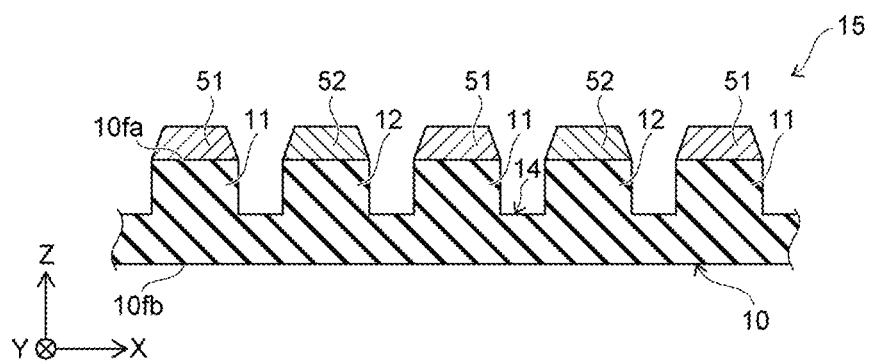
FIG. 3A is a schematic cross-sectional view illustrating the method of manufacturing a light-emitting device according to the embodiment.
Figure 3B:
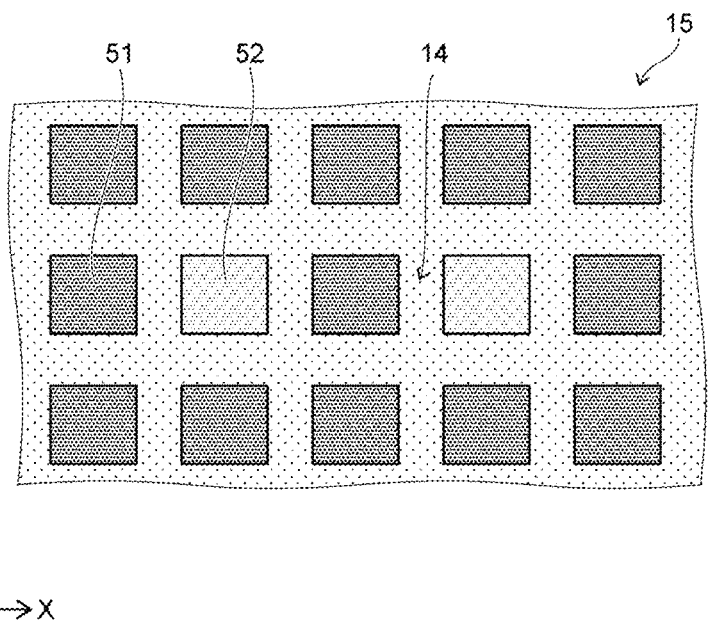
FIG. 3B is a schematic plan view illustrating the method of manufacturing a light-emitting device according to the embodiment.

In the structure body providing step, a structure body 15 illustrated in FIG. 3A and FIG. 3B is provided. The structure body 15 can be formed as below. For example, a first substrate 10 is used as a growth substrate to grow a semiconductor layered body 50 on a first surface 10fa of the first substrate 10 as shown in FIG. 2A and FIG. 2B. For example, the first substrate 10 is a silicon substrate. For example, the first substrate 10 has a thickness of 200 μm or more and 1,000 μm or less. For example, the semiconductor layered body 50 and the first substrate 10 are partially removed to form grooves 14 in the first substrate 10. This step corresponds to, for example, a groove forming step. The depth of each groove 14 is, for example, 10% or more and 50% or less of the thickness of the first substrate 10, and preferably 20% or more and 40% or less of the thickness of the first substrate 10. With the groove 14 having the depth of 10% or more of the thickness of the first substrate 10, the amount of the first substrate 10 to be removed can be reduced in the first transfer step described below. With the groove 14 having the depth of 50% or less of the thickness of the first substrate 10, the strength of the first substrate 10 can be maintained. Specifically, the groove 14 has a depth of, for example, 20 μm or more and 500 μm or less. The depth of the groove 14 is the distance from the surface defining the bottom of the groove 14 to the first surface 10fa of the first substrate 10 in the Z-axis direction.

The structure body 15 illustrated in FIG. 3A and FIG. 3B is thus formed. The structure body 15 includes the first substrate 10. The first substrate 10 has the first surface 10fa and a second surface 10fb. For example, the second surface 10fb is a surface opposite to the first surface 10fa.

A plurality of first light-emitting element portions 51 and a plurality of second light-emitting element portions 52 are provided on the first surface 10fa of the first substrate 10. The first surface 10fa includes a plurality of first regions 11 and a plurality of second regions 12. One of the first light-emitting element portions 51 is located on each respective one of the first regions 11. One of the second light-emitting element portions 52 is located on each respective one of the second regions 12. The first light-emitting element portions 51 and the second light-emitting element portions 52 are formed by, for example, partially removing the semiconductor layered body 50 after the semiconductor layered body 50 is formed on the first surface 10fa of the first substrate 10 in the structure body providing step.

For example, the first surface 10fa is located between the second surface 10fb and the first light-emitting element portions 51. For example, the first surface 10fa is located between the second surface 10fb and the second light-emitting element portions 52. In the present example, the first regions 11 and the second regions 12 are alternately arranged along the X-axis direction as shown in FIG. 3A. The first light-emitting element portions 51 and the second light-emitting element portions 52 are alternately arranged along the X-axis direction as shown in FIG. 3A.

A direction from the first substrate 10 to the semiconductor layered body 50 is referred to as the Z-axis direction as shown in FIG. 3A. A direction perpendicular to the Z-axis direction is referred to as the X-axis direction. The direction perpendicular to the Z-axis direction and the X-axis direction is referred to as the Y-axis direction.

For example, the first surface 10fa substantially are disposed along the X-Y plane. In the example shown in FIG. 3A, for example, the first surface 10fa of the first substrate 10 is the upper surface of the first substrate 10. The semiconductor layered body 50 is formed on the first surface 10fa of the first substrate 10. The second surface 10fb of the first substrate 10 is, for example, the lower surface of the first substrate 10.

In First Structure Body Fixing Step S120 illustrated in FIG. 1A, the structure body 15 is fixed to a second substrate 20.

Figure 4A:
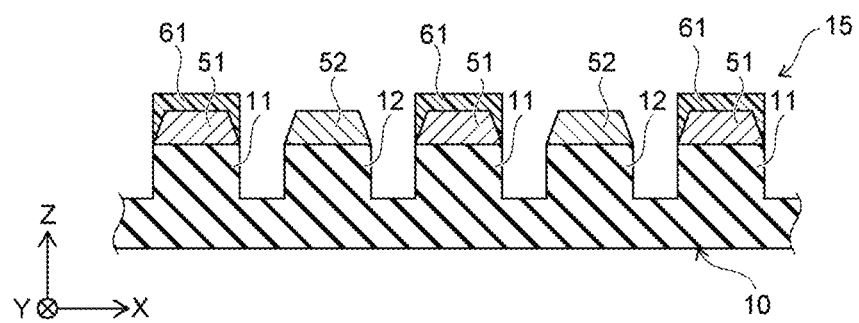
FIG. 4A is a schematic cross-sectional view illustrating the method of manufacturing a light-emitting device according to the embodiment.
Figure 4B:
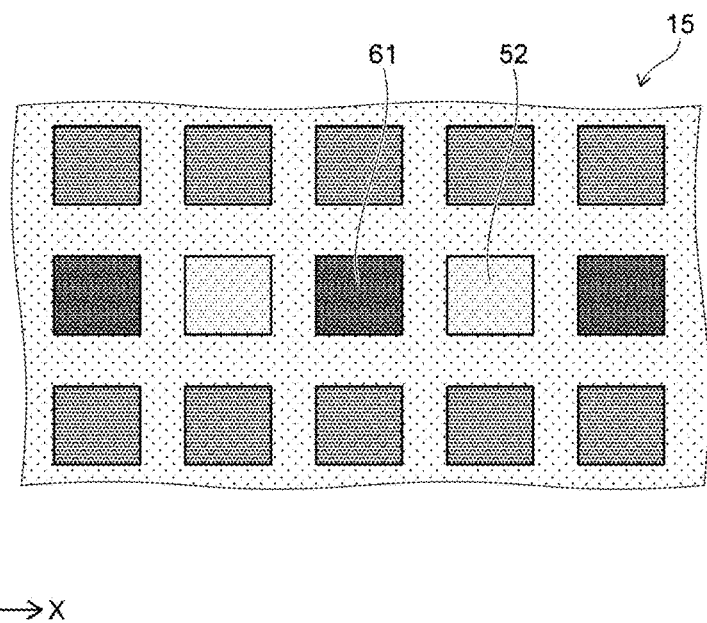
FIG. 4B is a schematic plan view illustrating the method of manufacturing a light-emitting device according to the embodiment.

For example, in First Structure Body Fixing Step S120, first members 61 are disposed on the respective first light-emitting element portions 51 as shown in FIG. 4A and FIG. 4B. For example, the first member 61 covers a surface of the first light-emitting element portion 51. The first members 61 are not disposed on the respective second light-emitting element portions 52. The first members 61 contain, for example, resin, a dielectric substance, or metal. This step corresponds to a first member disposing step.

Figure 5A:
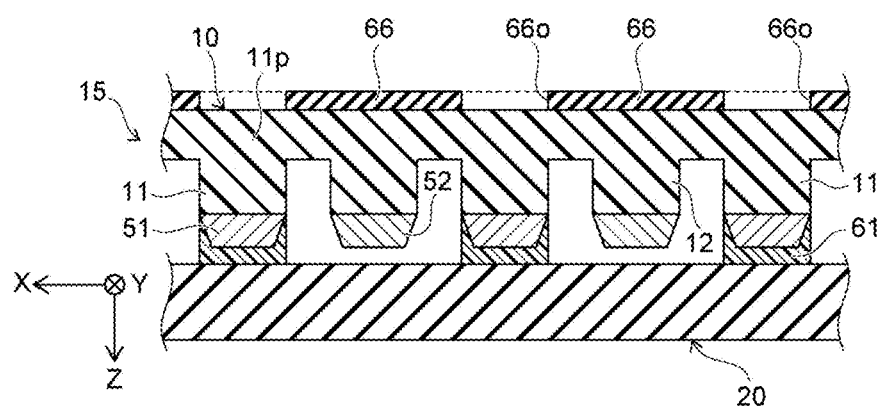
FIG. 5A is a schematic cross-sectional view illustrating the method of manufacturing a light-emitting device according to the embodiment.

After that, the structure body 15 is faced to the second substrate 20 such that the first light-emitting element portions 51 are fixed to the second substrate 20 with the first members 61 therebetween as shown in FIG. 5A. The second light-emitting element portions 52 face the second substrate 20. The first light-emitting element portions 51 are fixed to the second substrate 20 using the first members 61. At this time, the second light-emitting element portions 52 are not fixed to the second substrate 20. For example, the second light-emitting element portions 52 are not in contact with the second substrate 20. This step corresponds to a first fixing step. The second substrate 20 is, for example, a transfer substrate. For example, a silicon substrate, a glass substrate, or a resin substrate is used for the second substrate 20. The first light-emitting element portions 51 can be collectively transferred to the second substrate 20 in the first fixing step by disposing the first members 61 on the respective first light-emitting element portions 51 to be fixed to the second substrate 20. The first light-emitting element portions 51 can be transferred to the second substrate 20 more easily than in the case in which the first light-emitting element portions 51 are individually transferred, and accordingly high producibility may be obtained.

The first members 61 can be selected according to the method of fixing the first light-emitting element portions 51 to the second substrate 20. For example, in the case in which the first light-emitting element portions 51 are fixed to the second substrate 20 by thermocompression bonding, resin is used for the first members 61. In this case, for example, resin films can be selectively disposed on the first light-emitting element portions 51 by using photosensitive resin as the resin. For example, in the case in which the first light-emitting element portions 51 are fixed to the second substrate 20 by surface-activated bonding, which is a room temperature bonding method, a dielectric substance such as silicon oxide and silicon nitride can be used for the first members 61.

In first transfer step S130 illustrated in FIG. 1A, for example, the first substrate 10 is partially removed from the second surface 10fb side in a state in which the first light-emitting element portions 51 are fixed to the second substrate 20.

Figure 5B:
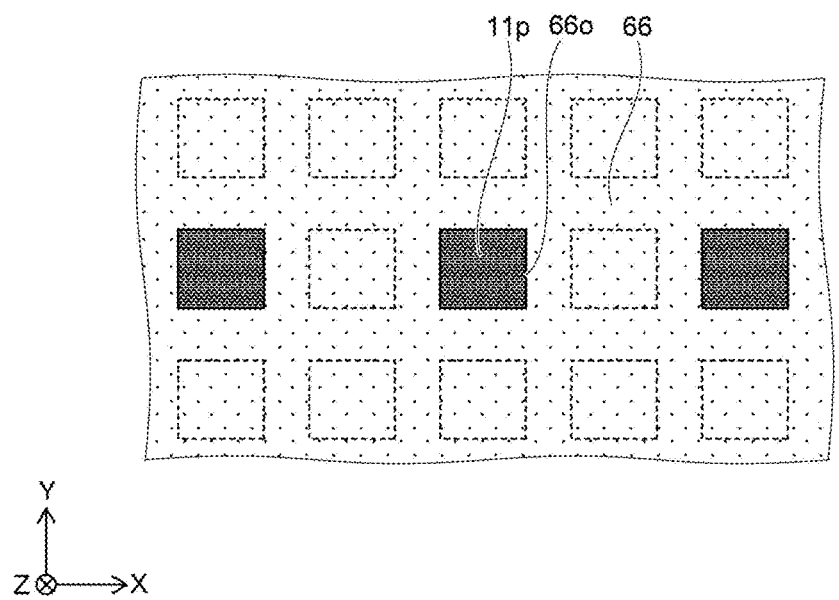
FIG. 5B is a schematic plan view illustrating the method of manufacturing a light-emitting device according to the embodiment.
Figure 6A:
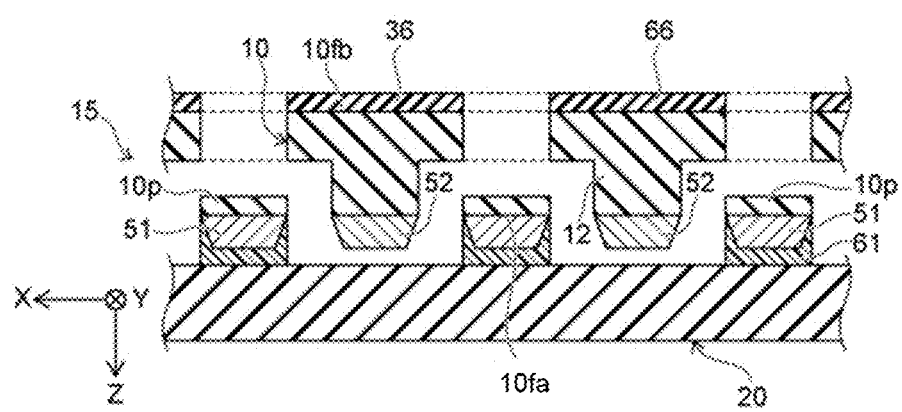
FIG. 6A is a schematic cross-sectional view illustrating the method of manufacturing a light-emitting device according to the embodiment.
Figure 6B:
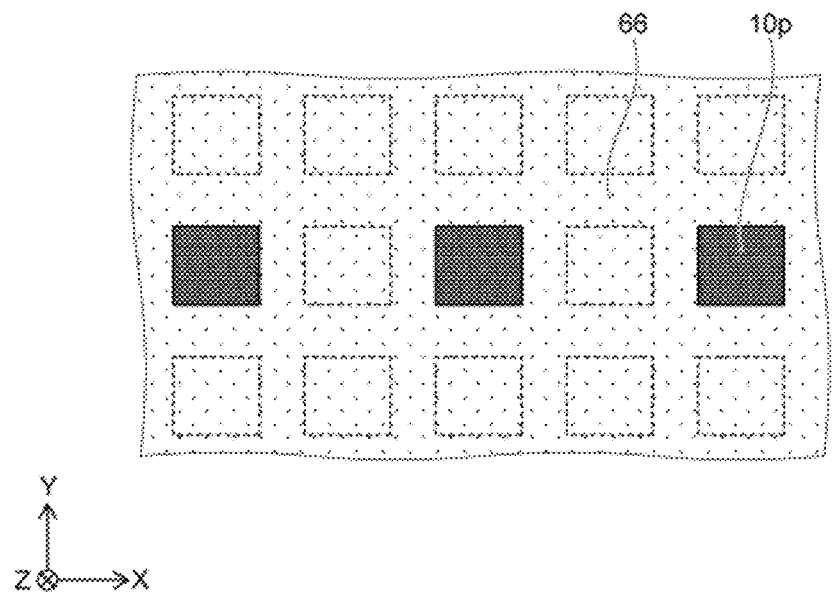
FIG. 6B is a schematic plan view illustrating the method of manufacturing a light-emitting device according to the embodiment.

For example, a mask 66 is formed on the second surface 10fb of the first substrate 10 as shown in FIG. 5A. The mask 66 is, for example, a resist or an insulating film. The mask 66 can be formed using a technique such as photolithography. The mask 66 has openings 66o corresponding to the first regions 11. As shown in FIG. 5B, portions 11p of the first regions 11 are exposed from the mask 66 having the openings 66o. As shown in FIG. 6A and FIG. 6B, the portions 11p of the first substrate 10 overlapping with the first regions 11 when viewed from the second surface 10fb are removed from the second surface 10fb using the mask 66 as a mask. In the removal of the first substrate 10, for example, the Bosch process is performed. The thickness of the first substrate 10 to be removed from the second surface 10fb is, for example, 10% or more and 50% or less of the thickness of the first substrate 10, and preferably 20% or more and 40% or less of the thickness of the first substrate 10. Specifically, the thickness of the first substrate 10 to be removed is, for example, 20 μm or more and 500 μm or less. After the first substrate 10 is partially removed from the second surface 10fb, portion of the first substrate 10 having a thickness equal to or less than the depth of the grooves 14 is left on the first light-emitting element portions 51.

The portions 11p of the first regions 11 overlapping with the first regions 11 when viewed from the second surface 10fb are removed, and therefore the first light-emitting element portions 51 are separated from the first substrate 10 while being fixed to the second substrate 20. The first light-emitting element portions 51 are thus transferred from the first substrate 10 to the second substrate 20. Portions 10p of the first substrate 10 are left on the first light-emitting element portions 51 as shown in FIG. 6A. The first light-emitting element portions 51 can be easily transferred to the second substrate 20 by removing the first substrate 10 from the second surface 10fb to reach the grooves 14 that have been formed in the first substrate 10 between the first regions 11 and the second regions 12 in the groove forming step described above. In First Transfer Step S130, the grooves 14 formed in the portions of the first substrate 10 in which the first light-emitting element portions 51 and the second light-emitting element portions 52 are not located are used, which can reduces the amount of the first substrate 10 to be removed in the thickness direction of the first substrate 10, so that the producibility can be improved.

Figure 7A:
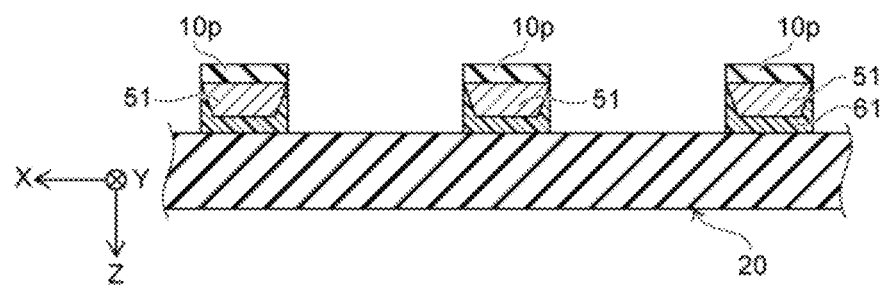
FIG. 7A is a schematic cross-sectional view illustrating the method of manufacturing a light-emitting device according to the embodiment.
Figure 7B:
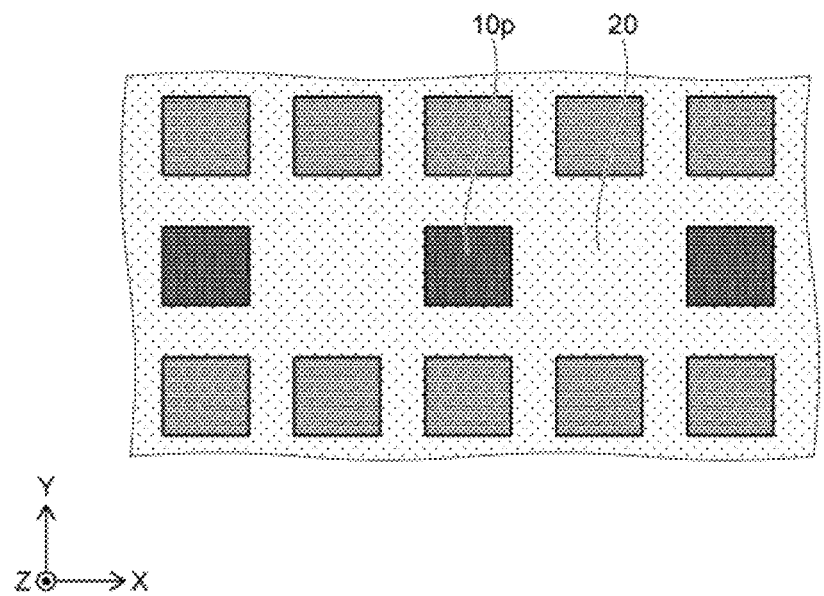
FIG. 7B is a schematic plan view illustrating the method of manufacturing a light-emitting device according to the embodiment.

In separation step S140 illustrated in FIG. 1A, the structure body 15 in which the second light-emitting element portions 52 are located on the second regions 12 of the first substrate 10 as shown in FIG. 6A is separated from the second substrate 20 as shown in FIG. 7A. As shown in FIG. 7A, after Separation Step S140, the first members 61 fix the first light-emitting element portions 51 to the second substrate 20. As shown in FIG. 7A and FIG. 7B, the second light-emitting element portions 52 are not fixed to the second substrate 20, and only the first light-emitting element portions 51 are arranged in the X-axis direction.

Figure 8A:
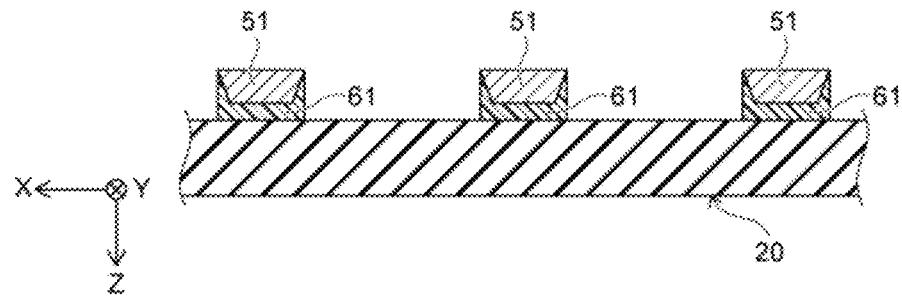
FIG. 8A is a schematic cross-sectional view illustrating the method of manufacturing a light-emitting device according to the embodiment.
Figure 8B:
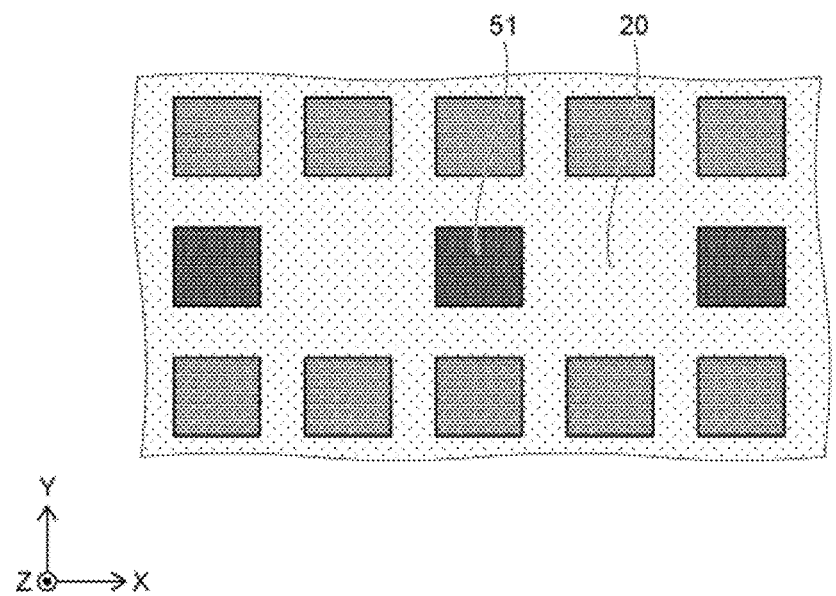
FIG. 8B is a schematic plan view illustrating the method of manufacturing a light-emitting device according to the embodiment.

The portions 10p of the first substrate 10 left on the first light-emitting element portions 51 are removed by, for example, reactive ion etching (RIE). Accordingly, the first light-emitting element portions 51 are exposed as shown in FIG. 8A and FIG. 8B. The light-emitting device in which the first light-emitting element portions 51 are fixed to the second substrate 20 is thus manufactured.

In the manufacturing method according to the present embodiment, the first light-emitting element portions 51 on the first substrate 10 can be collectively transferred to the second substrate 20. The first light-emitting element portions 51 can be transferred more easily than in the case in which the first light-emitting element portions 51 are individually transferred. The present embodiment may provide a method of manufacturing a light-emitting device with improved producibility.

In mounting step S150 shown in FIG. 1A, the light-emitting device obtained through Separation Step S140 is mounted on, for example, a mounting board. The mounting board can be a carrier board.

Figure 9A:
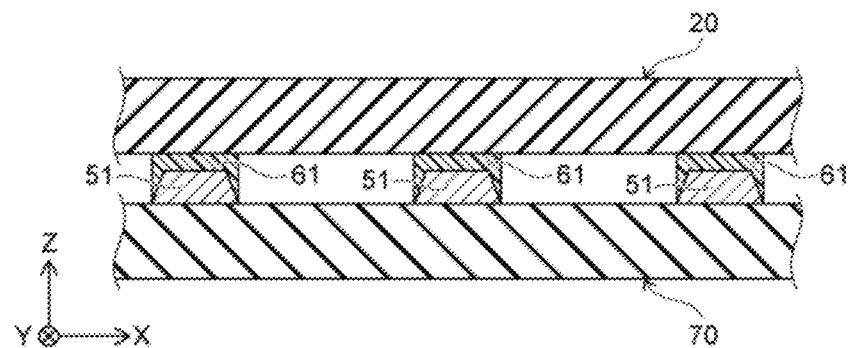
FIG. 9A is a schematic cross-sectional view illustrating the method of manufacturing a light-emitting device according to the embodiment.
Figure 9B:
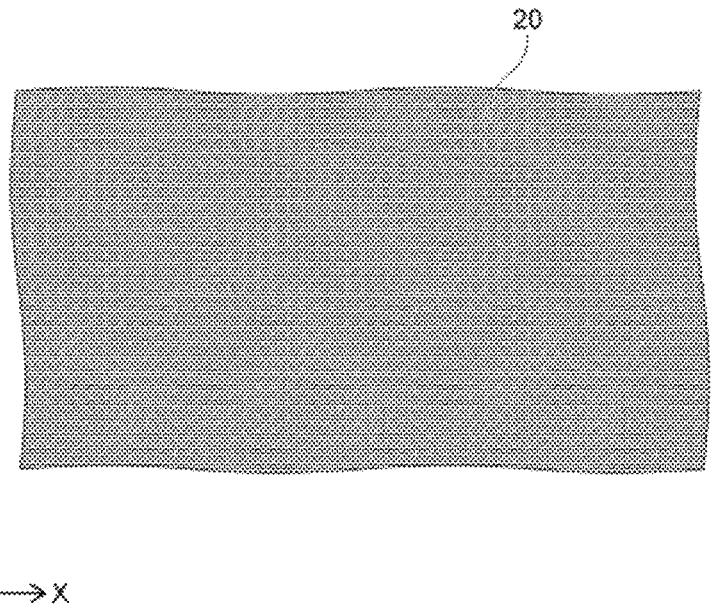
FIG. 9B is a schematic plan view illustrating the method of manufacturing a light-emitting device according to the embodiment.

For example, as shown in FIG. 9A and FIG. 9B, in Mounting Step S150, the second substrate 20 faces a mounting board 70 such that the first light-emitting element portions 51 fixed to the second substrate 20 face the mounting board 70. Surfaces of the first light-emitting element portions 51 not covered with the first members 61 are fixed to the mounting board 70.

Figure 10A:
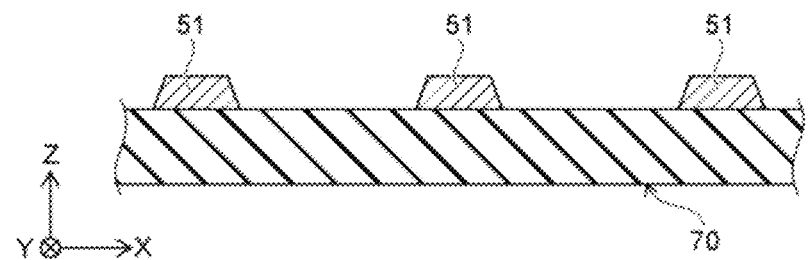
FIG. 10A is a schematic cross-sectional view illustrating the method of manufacturing a light-emitting device according to the embodiment.
Figure 10B:
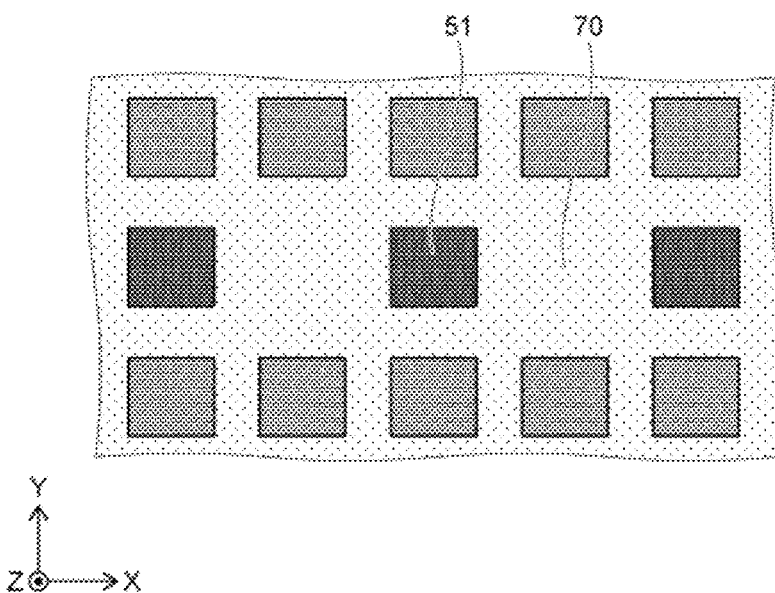
FIG. 10B is a schematic plan view illustrating the method of manufacturing a light-emitting device according to the embodiment.

The second substrate 20 is removed from the first light-emitting element portions 51 as shown in FIG. 10A and FIG. 10B. The first members 61 on the first light-emitting element portions 51 are also removed at this time.

For example, in the case in which the first light-emitting element portions 51 are bonded to the second substrate 20 by thermocompression bonding using first members 61 formed of a resin-based material, the second substrate 20 can be removed from the first light-emitting element portions 51 by removing the first members 61 by, for example, wet etching using a stripping solution. For example, in the case in which the first light-emitting element portions 51 are bonded to the second substrate 20 by surface-activated bonding, the second substrate 20 and the first members 61 are removed by etching. The first light-emitting element portions 51 can be collectively mounted on the mounting board 70 by such a method.

In the above example, the first members 61 fix the first light-emitting element portions 51 to the second substrate 20. The first light-emitting element portions 51 can be directly fixed to the second substrate 20 in the embodiment.

Examples of Second Structure Body Fixing Step S141 and Second Transfer Step S142 shown in FIG. 1B will next be described.

In Second Structure Body Fixing Step S141, for example, second members 62 (see FIG. 11A) are disposed on the second light-emitting element portions 52 after Separation Step S140 by substantially the same method as the method described referring to FIG. 4A and FIG. 4B. A material used for the second members 62 can be substantially the same as the material used for the first members 61.

Figure 11A:
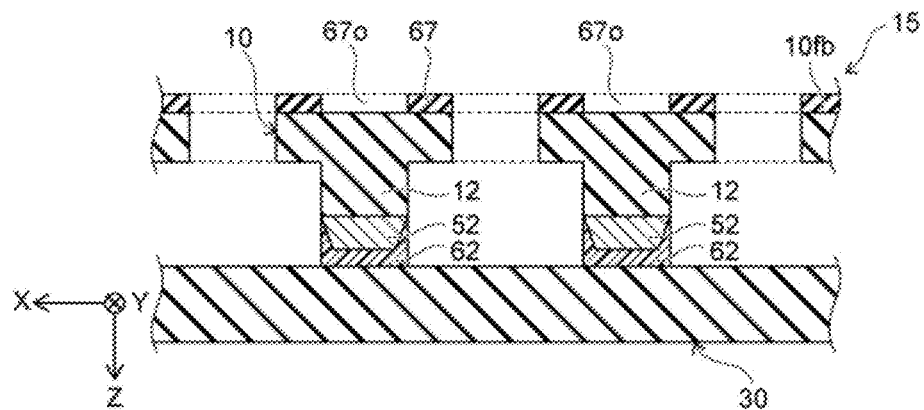
FIG. 11A is a schematic cross-sectional view illustrating the method of manufacturing a light-emitting device according to the embodiment.

The structure body 15 faces a third substrate 30 such that the second light-emitting element portions 52 provided with the second members 62 face the third substrate 30 as shown in FIG. 11A. The third substrate 30 can be a substrate other than the second substrate 20. The third substrate 30 is, for example, a substrate used for transferring the second light-emitting element portions 52 from the first substrate 10. The second light-emitting element portions 52 are fixed to the third substrate 30 in this state using the second members 62.

Figure 11B:
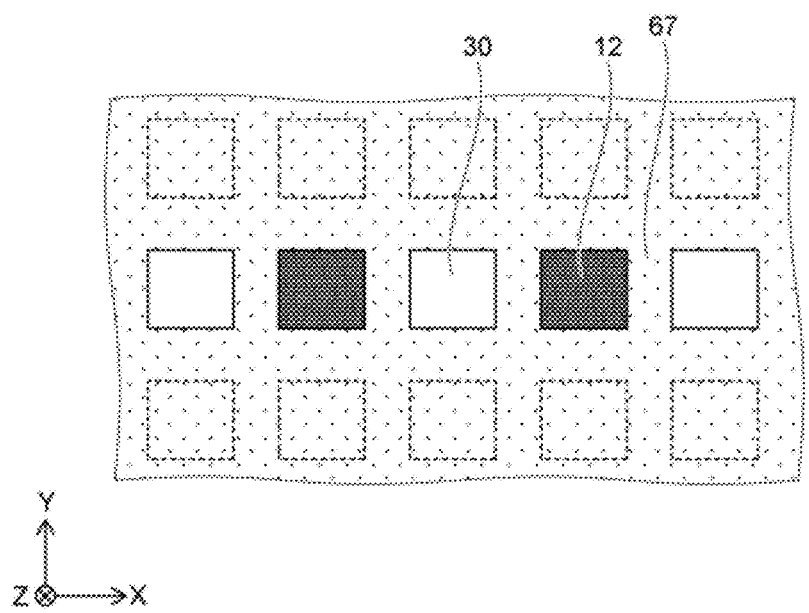
FIG. 11B is a schematic plan view illustrating the method of manufacturing a light-emitting device according to the embodiment.

In Second Transfer Step S142 shown in FIG. 1B, the first substrate 10 is partially removed from the second surface 10fb in a state in which the second light-emitting element portions 52 are fixed to the third substrate 30. For example, a mask 67 is formed on the second surface 10fb of the first substrate 10 as shown in FIG. 11A and FIG. 11B. In this example, the mask 67 has openings 67o overlapping with the second regions 12 when viewed from the second surface 10fb as shown in FIG. 11A. As shown in FIG. 11A and FIG. 11B, the second regions 12 are partially exposed from the mask 67 having the openings 67o. The mask 67 is formed by substantially the same method as the method described regarding the mask 66.

Figure 12A:
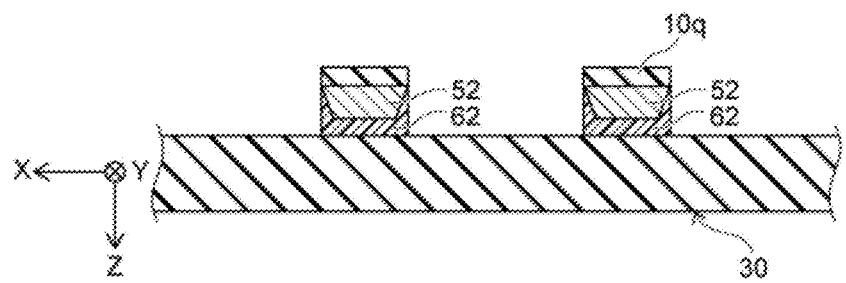
FIG. 12A is a schematic cross-sectional view illustrating the method of manufacturing a light-emitting device according to the embodiment.
Figure 12B:
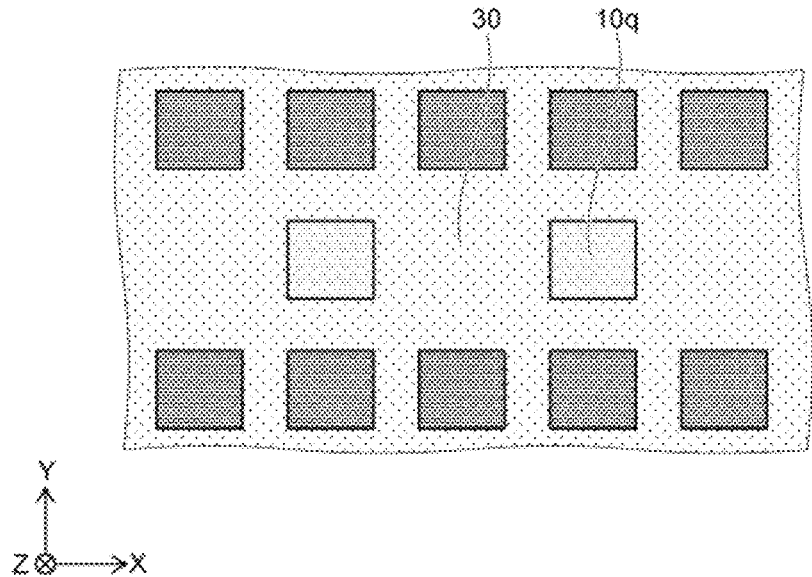
FIG. 12B is a schematic plan view illustrating the method of manufacturing a light-emitting device according to the embodiment.

As shown in FIG. 12A and FIG. 12B, portions 10q of the first substrate 10 overlapping with the second regions 12 when viewed from the second surface 10fb side are removed from the second surface 10fb using the mask 67 as a mask. In the removal of the first substrate 10, for example, the Bosch process is performed. The thickness of the first substrate 10 to be removed from the second surface 10fb side in this step can be substantially the same as the thickness of the first substrate 10 described with reference to FIG. 6A and FIG. 6B.

The portions 10q of the first substrate 10 overlapping with the second regions 12 when viewed from the second surface 10fb side are removed, and therefore the second light-emitting element portions 52 are separated from the first substrate 10 while being fixed to the third substrate 30. The second light-emitting element portions 52 are thus transferred from the first substrate 10 to the third substrate 30. Portions (portions 10q) of the first substrate 10 left on the second light-emitting element portions 52 are removed by, for example, reactive ion etching (RIE).

Figure 13A:
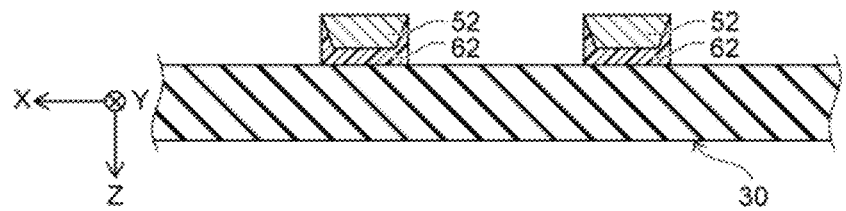
FIG. 13A is a schematic cross-sectional view illustrating the method of manufacturing a light-emitting device according to the embodiment.
Figure 13B:
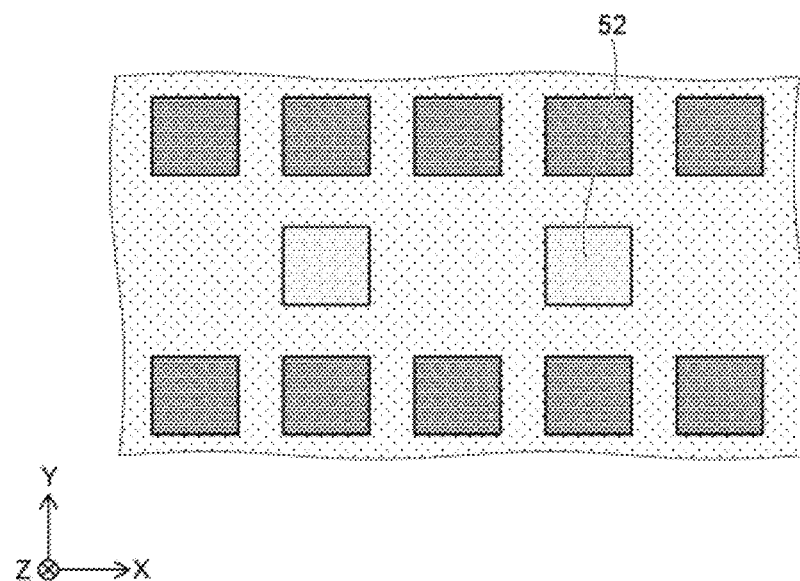
FIG. 13B is a schematic plan view illustrating the method of manufacturing a light-emitting device according to the embodiment.

The upper surfaces of the second light-emitting element portions 52 are thus exposed as shown in FIG. 13A and FIG. 13B. The second light-emitting element portions 52 are thus fixed to the third substrate 30.

For example, in Mounting Step S160 shown in FIG. 1B, the second light-emitting element portions 52 fixed on the third substrate 30 are mounted to the mounting board 70 on which the first light-emitting element portions 51 have been mounted.

Figure 14A:
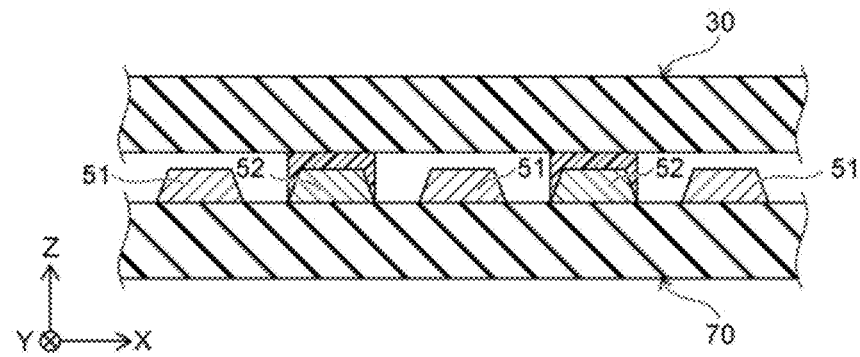
FIG. 14A is a schematic cross-sectional view illustrating the method of manufacturing a light-emitting device according to the embodiment.
Figure 14B:
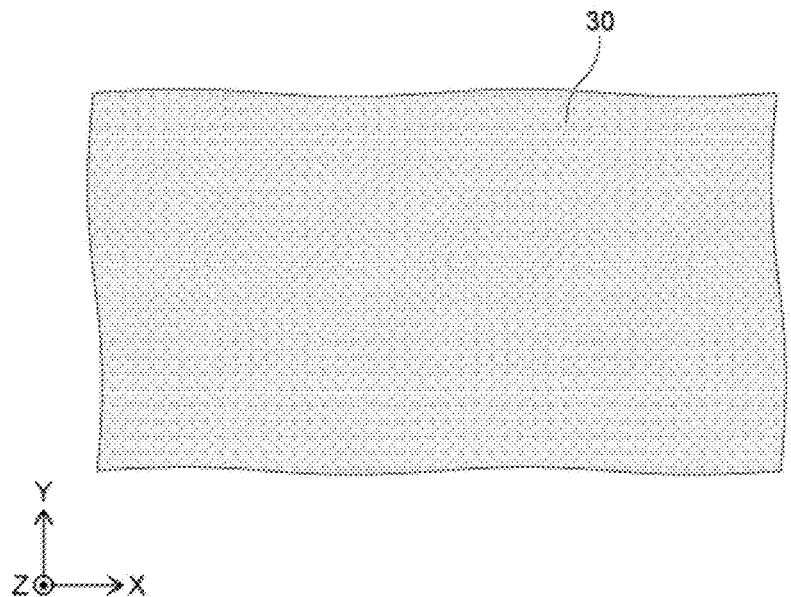
FIG. 14B is a schematic plan view illustrating the method of manufacturing a light-emitting device according to the embodiment.

As shown in FIG. 14A and FIG. 14B, in Mounting Step S160, the second light-emitting element portions 52 on the third substrate 30 are respectively mounted to portions between the first light-emitting element portions 51 mounted on the mounting board 70. The first light-emitting element portions 51 and the second light-emitting element portions 52 are alternately arranged on the mounting board 70.

Figure 15A:
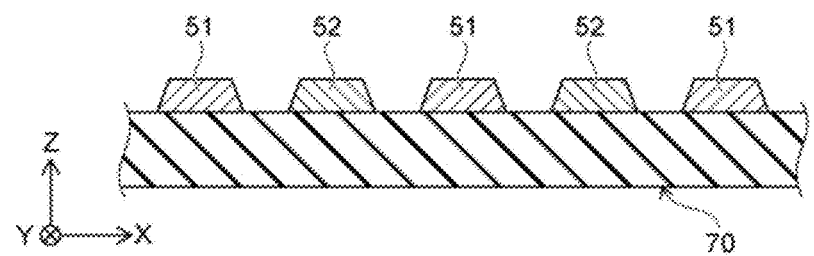
FIG. 15A is a schematic cross-sectional view illustrating the method of manufacturing a light-emitting device according to the embodiment.
Figure 15B:
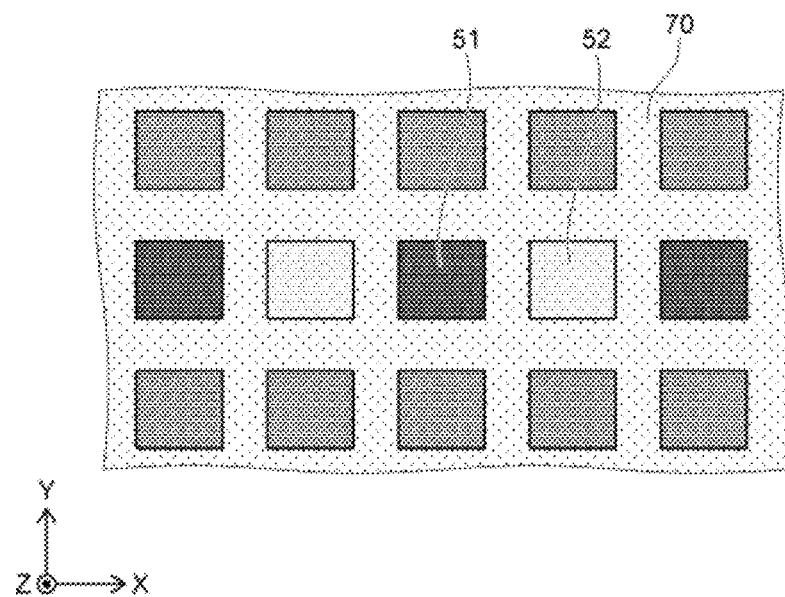
FIG. 15B is a schematic plan view illustrating the method of manufacturing a light-emitting device according to the embodiment.

After that, as shown in FIG. 15A and FIG. 15B, the second light-emitting element portions 52 are respectively fixed between the first light-emitting element portions 51 on the mounting board 70, and the third substrate 30 is removed. The second members 62 on the second light-emitting element portions 52 are also removed at this time. The third substrate 30 and the second members 62 can be removed by substantially the same method as the removal of the second substrate 20 and the first members 61 described above.

By the manufacturing method according to the present embodiment, a light-emitting device including a plurality of first light-emitting element portions 51 and a plurality of second light-emitting element portions 52 is obtained. In the present embodiment, a plurality of light-emitting element portions can be precisely mounted on a mounting board or a transfer substrate. The first light-emitting element portions 51 on the first substrate 10 can be collectively transferred to the second substrate 20 in the embodiment, so that high producibility may be obtained compared with the case in which a plurality of singulated light-emitting elements are individually mounted.

In the above example, the second members 62 fix the second light-emitting element portions 52 to the third substrate 30. Alternatively, the second light-emitting element portions 52 can be directly fixed to the third substrate 30 in the embodiment.

In the steps described referring to FIG. 11A to FIG. 15B above, the wavelength distribution of "second light-emitting element portions" can differ from the wavelength distribution of the "second light-emitting element portions" illustrated in FIG. 3A. For example, the wavelength distribution of light emitted from the second light-emitting element portions 52 illustrated in FIG. 3A can be the same as the wavelength distribution of light emitted from the first light-emitting element portions 51 illustrated in FIG. 3A. Alternatively, a plurality of light-emitting element portions having different wavelength distributions can be mounted on the mounting board 70.

On the other hand, the wavelength distribution of light emitted from the "second light-emitting element portions 52" illustrated in FIG. 11A to FIG. 15B can differ from the wavelength distribution of light emitted from the "first light-emitting element portions 51" illustrated in FIG. 10A. Further, in the steps illustrated in FIG. 11A to FIG. 15B, "a plurality of third light-emitting element portions" different from the "first light-emitting element portions 51" and the "second light-emitting element portions 52" can be mounted on the mounting board 70. In this case, the pitches of the "first light-emitting element portions 51" and the "second light-emitting element portions 52" can be adjusted as appropriate to provide regions in which the "third light-emitting element portions" are to be mounted.

Certain embodiments of the present disclosure have been described above with reference to specific examples. However, the scope of the present invention is not limited to those specific examples. For example, specific structures of the substrates, the semiconductor layered body, and the light-emitting element portions included in the light-emitting device can be appropriately selected from known art by a person skilled in the art, and variations of such specific configurations are within the scope of the present invention as long as a person skilled in the art can implement the present invention in a similar manner and can obtain similar effects.

Further, two or more elements, combined to the extent technical possible, in the specific examples are also within the scope of the present invention as long as the combination of the two or more elements involves the gist of the present invention.

What is claimed is:

1. A method of manufacturing a light-emitting device, the method comprising:
    providing a structure body comprising:
        a first substrate having a first surface and a second surface opposite to the first surface, the first surface including first regions and second regions;
        first light-emitting element portions respectively located on the first regions of the first surface; and
        second light-emitting element portions respectively located on the second regions of the first surface;
    while the first light-emitting element portions and the second light-emitting element portions face a second substrate, fixing the first light-emitting element portions to the second substrate without fixing the second light-emitting element portions to the second substrate;
    subsequently, transferring the first light-emitting element portions from the first substrate to the second substrate by removing, from the second surface, portions of the first substrate overlapping the first regions when viewed from the second surface; and
    subsequently, separating the first substrate from the second substrate in a state in which the second light-emitting element portions are located on the second regions.

2. The method of manufacturing a light-emitting device according to claim 1, wherein:
    the step of fixing the first light-emitting element portions to the second substrate comprises:
        disposing first members respectively on the first light-emitting element portions without disposing the first members on the second light-emitting element portions, and
        fixing the first light-emitting element portions to the second substrate via the first members.

3. The method of manufacturing a light-emitting device according to claim 1, further comprising:
    fixing the second light-emitting element portions to a third substrate; and
    subsequently, transferring the second light-emitting element portions from the first substrate to the third substrate by removing, from the second surface, portions of the first substrate overlapping the second regions when viewed from a second surface side.

4. The method of manufacturing a light-emitting device according to claim 2, further comprising:
    fixing the second light-emitting element portions to a third substrate; and
    subsequently, transferring the second light-emitting element portions from the first substrate to the third substrate by removing, from the second surface, portions of the first substrate overlapping the second regions when viewed from a second surface side.

5. The method of manufacturing a light-emitting device according to claim 3, wherein:
    the step of fixing the second light-emitting element portions to the third substrate comprises:
        disposing second members respectively on the second light-emitting element portions, and
        fixing the second light-emitting element portions to the third substrate via the second members.

6. The method of manufacturing a light-emitting device according to claim 4, wherein:
    the step of fixing the second light-emitting element portions to the third substrate comprises:
        disposing second members respectively on the second light-emitting element portions, and
        fixing the second light-emitting element portions to the third substrate via the second members.

7. The method of manufacturing a light-emitting device according to claim 5, wherein:
    the first surface of the first substrate further comprises third regions,
    the structure body further comprises third light-emitting element portions respectively located on the third regions,
    the third light-emitting element portions are not fixed to the third substrate in the step of fixing the second light-emitting element portions to the third substrate, and
    after the step of transferring the second light-emitting element portions from the first substrate to the third substrate, the third light-emitting element portions are separated from the third substrate while being located on the third regions.

8. The method of manufacturing a light-emitting device according to claim 6, wherein:
    the first surface of the first substrate further comprises third regions,
    the structure body further comprises third light-emitting element portions respectively located on the third regions,
    the third light-emitting element portions are not fixed to the third substrate in the step of fixing the second light-emitting element portions to the third substrate, and
    after the step of transferring the second light-emitting element portions from the first substrate to the third substrate, the third light-emitting element portions are separated from the third substrate while being located on the third regions.

9. The method of manufacturing a light-emitting device according to claim 1, wherein:
    the step of providing the structure body comprises:
        forming a semiconductor layered body on the first substrate, and
        forming the first light-emitting element portions and the second light-emitting element portions from the semiconductor layered body by removing parts of the semiconductor layered body.

10. The method of manufacturing a light-emitting device according to claim 2, wherein:
    the step of providing the structure body comprises:
        forming a semiconductor layered body on the first substrate, and
        forming the first light-emitting element portions and the second light-emitting element portions from the semiconductor layered body by removing parts of the semiconductor layered body.

11. The method of manufacturing a light-emitting device according to claim 3, wherein:
the step of providing the structure body comprises:
forming a semiconductor layered body on the first substrate, and
forming the first light-emitting element portions and the second light-emitting element portions from the semiconductor layered body by removing parts of the semiconductor layered body.

12. The method of manufacturing a light-emitting device according to claim 1, further comprising:
between the step of providing the structure body and the step of fixing the first light-emitting element portions to a second substrate, forming grooves in the first substrate by removing a portion of the first substrate between one of the first regions and one of the second regions from the first surface,
wherein, in the step of transferring the first light-emitting element portions from the first substrate to the second substrate, the first substrate is removed to reach the grooves.

13. The method of manufacturing a light-emitting device according to claim 2, further comprising:
between the step of providing the structure body and the step of fixing the first light-emitting element portions to a second substrate, forming grooves in the first substrate by removing a portion of the first substrate between one of the first regions and one of the second regions from the first surface,
wherein, in the step of transferring the first light-emitting element portions from the first substrate to the second substrate, the first substrate is removed to reach the grooves.

14. The method of manufacturing a light-emitting device according to claim 3, further comprising:
between the step of providing the structure body and the step of fixing the first light-emitting element portions to a second substrate, forming grooves in the first substrate by removing a portion of the first substrate between one of the first regions and one of the second regions from the first surface,
wherein, in the step of transferring the first light-emitting element portions from the first substrate to the second substrate, the first substrate is removed to reach the grooves.

15. The method of manufacturing a light-emitting device according to claim 1, wherein the first substrate comprises a silicon substrate.

16. The method of manufacturing a light-emitting device according to claim 2, wherein the first substrate comprises a silicon substrate.

17. The method of manufacturing a light-emitting device according to claim 3, wherein the first substrate comprises a silicon substrate.

* * * * *